(12) United States Patent
Roohparvar

(10) Patent No.: US 7,408,807 B2
(45) Date of Patent: Aug. 5, 2008

(54) NAND STRING WORDLINE DELAY REDUCTION

(75) Inventor: Frankie F. Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 111 days.

(21) Appl. No.: 11/412,217

(22) Filed: Apr. 26, 2006

(65) Prior Publication Data

US 2006/0203553 A1 Sep. 14, 2006

Related U.S. Application Data

(63) Continuation of application No. 10/910,882, filed on Aug. 4, 2004, now Pat. No. 7,064,981.

(51) Int. Cl.
*G11C 16/04* (2006.01)

(52) U.S. Cl. .............. 365/185.17; 365/185.02; 365/185.18

(58) Field of Classification Search ............. 365/185.17
See application file for complete search history.

(56) References Cited

U.S. PATENT DOCUMENTS

| | | | |
|---|---|---|---|
| 5,663,908 A | 9/1997 | Roohparvar | |
| 5,943,263 A | 8/1999 | Roohparvar | |
| 6,807,104 B2 * | 10/2004 | Arai et al. | 365/185.24 |
| 6,816,411 B2 | 11/2004 | Arai et al. | |
| 6,987,694 B2 * | 1/2006 | Lee | 365/185.17 |
| 7,023,739 B2 * | 4/2006 | Chen et al. | 365/185.28 |
| 7,221,588 B2 * | 5/2007 | Fasoli et al. | 365/185.17 |
| 2004/0037118 A1 | 2/2004 | Abedifard | |
| 2004/0105310 A1 * | 6/2004 | Arai et al. | 365/185.17 |
| 2005/0157578 A1 | 7/2005 | Noguchi et al. | |
| 2005/0185468 A1 | 8/2005 | Hosono et al. | |

* cited by examiner

*Primary Examiner*—Son L Mai
(74) *Attorney, Agent, or Firm*—Leffert, Jay & Polglaze, P.A.

(57) ABSTRACT

An improved NAND Flash memory and word line selection method has been described, that takes advantage of the asymmetric nature of the word line to word line capacitive coupling to reduce word line selection delay by driving the adjacent word lines to a higher initial voltage and then reducing it to the final target voltage. As the capacitive coupling in between the NAND word lines is a larger effect when the voltages are being lowered, this has the effect of damping out the voltage initially induced in the lower voltage word line by the rising voltages on the adjacent word lines, reducing the overall selection time.

21 Claims, 4 Drawing Sheets

NAND STRING WORDLINE DELAY REDUCTION

RELATED APPLICATION

This application is a Continuation of U.S. application Ser. No. 10/910,882, titled "NAND STRING WORDLINE DELAY REDUCTION," filed Aug. 4, 2004, now U.S. Pat. No. 7,064,981 which is commonly assigned and incorporated herein by reference.

TECHNICAL FIELD OF THE INVENTION

The present invention relates generally to memory devices and in particular the present invention relates to delay reduction in word lines of NAND memory devices.

BACKGROUND OF THE INVENTION

Memory devices are typically provided as internal storage areas in computers. The term memory identifies data storage that comes in the form of integrated circuit chips. In general, memory devices contain an array of memory cells for storing data, and row and column decoder circuits coupled to the array of memory cells for accessing the array of memory cells in response to an external address.

One type of memory is a non-volatile memory known as flash memory. A flash memory is a type of EEPROM (electrically-erasable programmable read-only memory) that can be erased and reprogrammed in blocks. Many modern personal computers (PCs) have their BIOS stored on a flash memory chip so that it can easily be updated if necessary. Such a BIOS is sometimes called a flash BIOS. Flash memory is also popular in wireless electronic devices because it enables the manufacturer to support new communication protocols as they become standardized and to provide the ability to remotely upgrade the device for enhanced features.

A typical flash memory comprises a memory array that includes a large number of memory cells arranged in row and column fashion. Each of the memory cells includes a floating-gate field-effect transistor capable of holding a charge. The cells are usually grouped into blocks. Each of the cells within a block can be electrically programmed on an individual basis by charging the floating gate. The charge can be removed from the floating gate by a block erase operation. The data in a cell is determined by the presence or absence of the charge on the floating gate.

A NAND flash memory device is a common type of flash memory device, so called for the logical form in which the basic memory cell configuration is arranged. Typically, the array of memory cells for NAND flash memory devices is arranged such that the control gate of each memory cell of a row of the array is connected to a word line. Columns of the array include strings (often termed NAND strings) of memory cells connected together in series, source to drain, between a pair of select lines, a source select line and a drain select line. The source select line includes a source select gate at each intersection between a NAND string and the source select line, and the drain select line includes a drain select gate at each intersection between a NAND string and the drain select line. The select gates are typically field-effect transistors. Each source select gate is connected to a source line, while each drain select gate is connected to a column bit line.

The memory array is accessed by a row decoder activating a row of memory cells by selecting the word line connected to a control gate of a memory cell. In addition, the word lines connected to the control gates of unselected memory cells of each string are driven to operate the unselected memory cells of each string as pass transistors, so that they pass current in a manner that is unrestricted by their stored data values. Current then flows from the source line to the column bit line through each NAND string via the corresponding select gates, restricted only by the selected memory cells of each string. This places the current-encoded data values of the row of selected memory cells on the column bit lines.

There is usually a delay in the selection of the word lines. One reason for this delay is that the word lines can have a relatively large resistance; because as memory devices become denser, the cross-sectional area of the word lines becomes smaller and the word lines typically extend to more memory cells. This increased resistance has the effect of increasing the RC time constant of the word lines, increasing the time for voltage signals to propagate down a given word line. The word lines are also often formed in close proximity to each other. This increases the capacitive coupling of each of the parallel word lines to their immediately adjacent word lines and can induce voltage spikes within the word line due to word line capacitive coupling to the adjacent word lines. Much of the individual word line selection delay in modern flash memories is due to this coupled voltage, which must be damped out by the word line driver circuit through the world line's own inherent RC time constant before the memory cells coupled to the word line can be reliably accessed.

For the reasons stated above, and for other reasons stated below which will become apparent to those skilled in the art upon reading and understanding the present specification, there is a need in the art for reducing word line selection delay in NAND memory devices.

DETAILED DESCRIPTION

Figure 1:
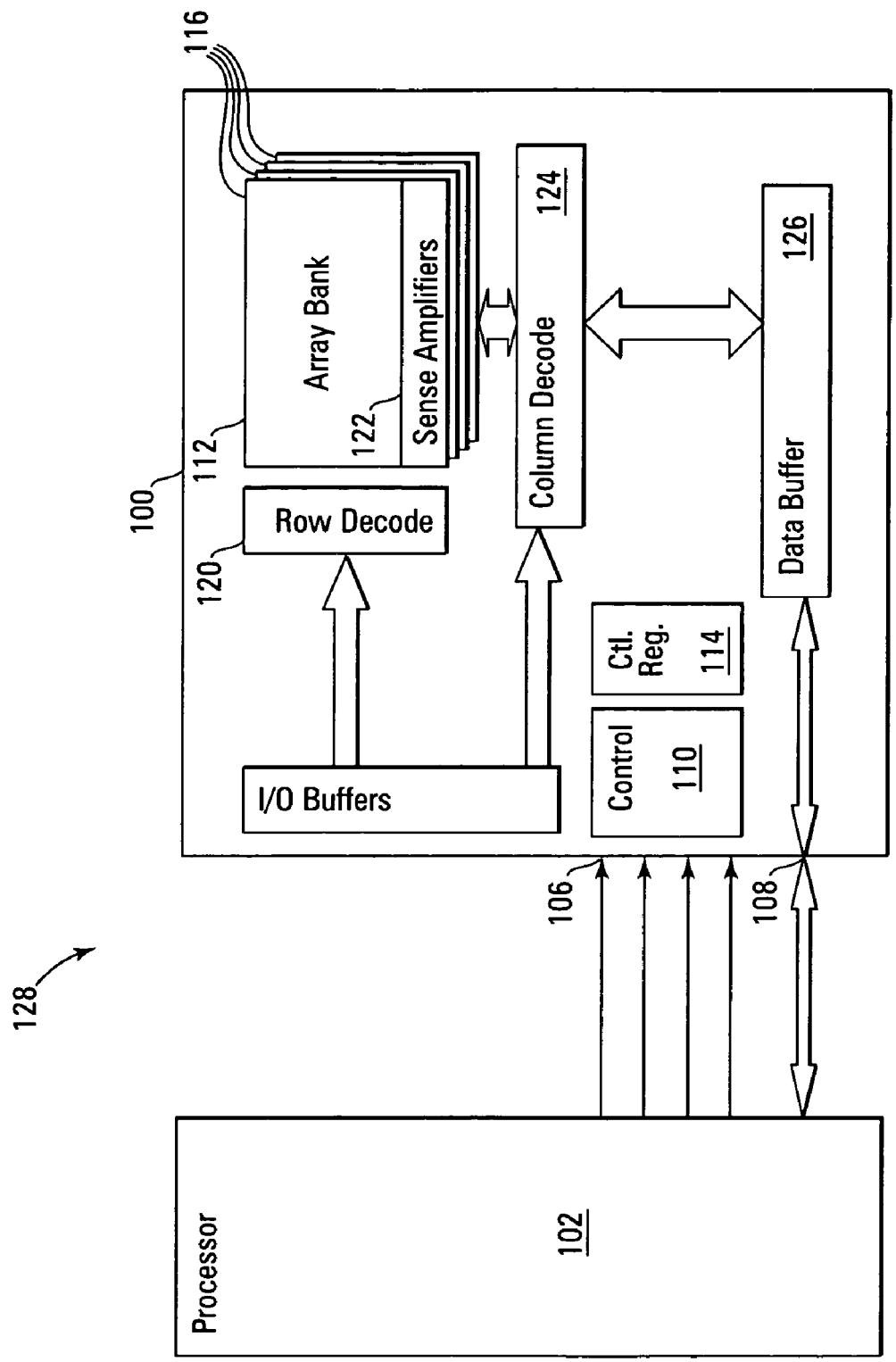
FIG. 1 is a simplified block diagram of a system containing a NAND architecture Flash memory device in accordance with an embodiment of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 shows a simplified diagram of a system 128 incorporating a NAND architecture Flash memory 100 embodiment of the present invention connected to a host 102, which is typically a processing device or memory controller. The Flash memory 100 has a control interface 106 and an address/ data interface 108 that are each connected to the processing device 102 to allow memory read and write accesses. It is noted that in alternative embodiments, the address/data interface 108 can be divided into separate interfaces. Internal to the Flash memory device a control state machine 110 directs the internal operation; managing the Flash memory array 112 and updating RAM control registers and non-volatile erase block management registers 114. The RAM control registers and tables 114 are utilized by the control state machine 110 during operation of the Flash memory 100. The Flash memory array 112 contains a sequence of memory banks or segments 116, each bank 116 is organized logically into a series of erase blocks (not shown). One or more charge pumps (not shown) generate elevated positive and/or negative voltages, where not externally available, for use internal to the Flash memory in read and write accesses.

Memory access addresses are received on the address/data interface 108 of the Flash memory 100 and divided into a row and column address portions. On a read access the row address is latched and decoded by row decode circuit 120, which selects and activates a row page (not shown) of memory cells and the other memory cells in their associated strings across a selected memory bank. The bit values encoded in the output of the selected row of memory cells are connected from a local bitline/string (not shown) to a global bitline (not shown) and detected by sense amplifiers 122 associated with the memory bank. The column address of the access is latched and decoded by the column decode circuit 124. The output of the column decode circuit selects the desired column data from the sense amplifier outputs and connected to the data buffer 126 for transfer from the memory device through the address/data interface 108. On a write access the row decode circuit 120 selects the row page and column decode circuit selects write sense amplifiers 122. Data values to be written are connected from the data buffer 126 to the write sense amplifiers 122 selected by the column decode circuit 124 and written to the selected floating gate memory cells (not shown) of the memory array 112. The written cells are then reselected by the row and column decode circuits 120, 124 and sense amplifiers 122 so that they can be read to verify that the correct values have been programmed into the selected memory cells.

Figure 2:
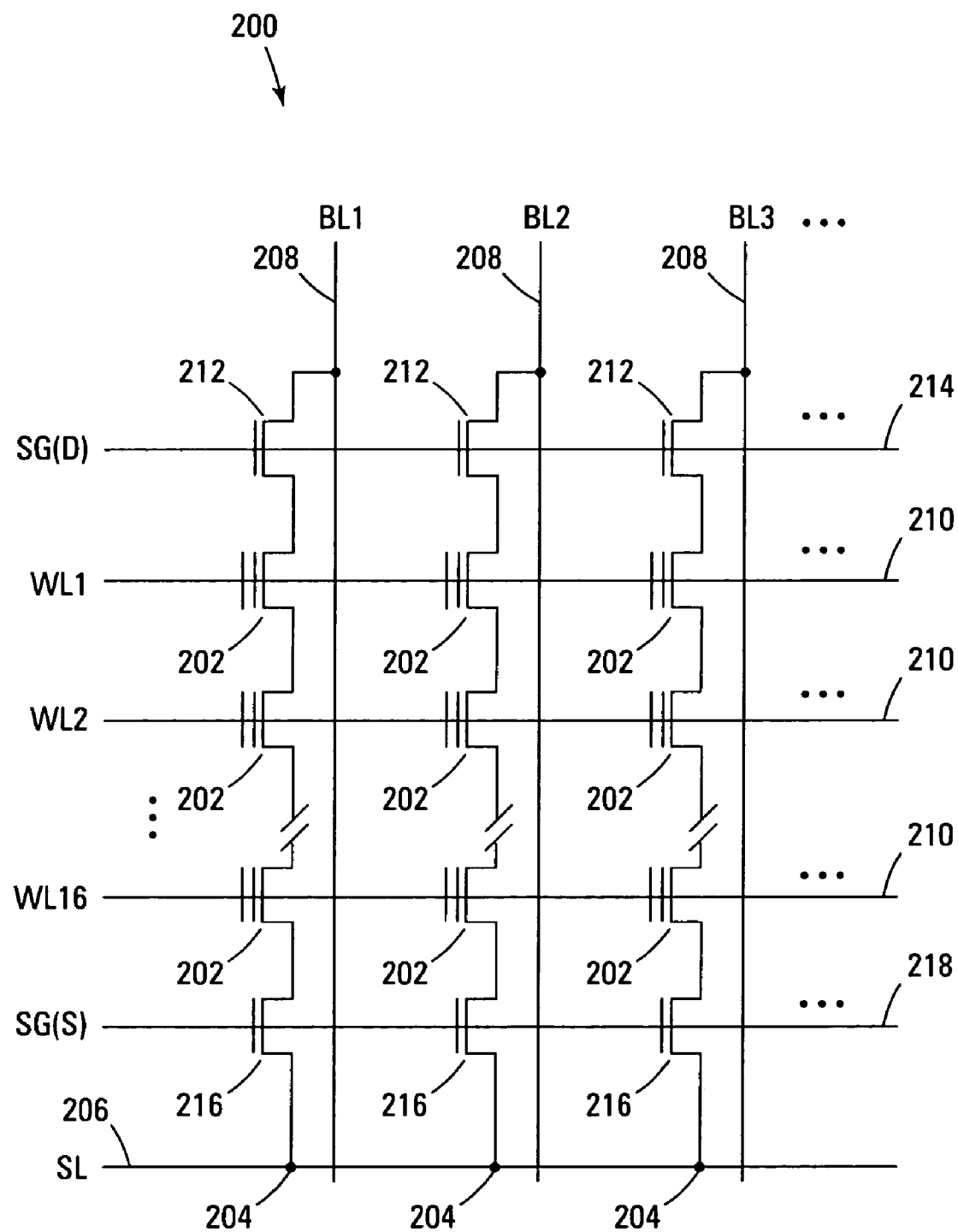
FIG. 2 is a simplified block diagram of a NAND architecture Flash memory array in accordance with an embodiment of the present invention.

FIG. 2 shows a simplified diagram of a NAND Flash architecture floating gate memory array 200 of an embodiment of the present invention. In FIG. 2, a NAND Flash array is comprised of a sequence of floating gate cell series strings 204. For one embodiment, each floating gate cell series string 204 contains 16 N-FET floating gate memory cells 202 that are connected drain to source in a series chain. Word lines (WL1-WL16) 210 that span across multiple series strings 204 are connected to the control gates of every floating gate cell 202 to control their operation. In operation, word lines 210 select the individual floating gate memory cell 202 in the series chain 204 to be written to or read from and operate the remaining floating gate memory cells 202 in each series string 204 in a pass through mode. Each series string 204 of floating gate memory cells 202 are connected to a source line 206 by a source select gate 216 and to an individual bitline (BL1-BLN) 208 by a drain select gate 212. The source select gates 216 are controlled by a source select gate control line (SG(S)) 218 connected to their control gates. The drain select gates 212 are controlled by a drain select gate control line (SG(D)) 214.

The floating gate memory cells of NAND architecture memory strings are typically formed from field effect transistors (FETs), such as a metal oxide semiconductor field effect transistor (MOSFET or MOS transistor), that are fabricated on an integrated circuit substrate. The floating gate memory cell includes a source region and a drain region that is spaced apart from the source region to form an intermediate channel region. A floating gate, typically made of doped polysilicon, is disposed over the channel region and is electrically isolated from the other cell elements by a dielectric material, typically an oxide. For example, tunnel insulator or oxide can be formed between the floating gate and the channel region. A control gate is located over the floating gate and is also typically made of doped polysilicon. The control gate is electrically separated from the floating gate by another dielectric layer, typically called the intergate insulator. Thus, the floating gate is electrically "floating" so that it is insulated from both the channel and the control gate. Charge is transported to or removed from the floating gates by specialized programming and erase operations, respectively. The insertion of charge on the floating gate alters the native threshold voltage of the floating gate transistor by imposing the trapped charge stored on the floating gate between the control gate and the channel of the device, increasing or lowering the effective threshold voltage level of the floating gate memory cell. It is noted that other floating gate or trapping memory cells are known and are used in alternative embodiments of the present invention, some of these memory cells can store multiple data bits in each cell. In particular, many of these alternative memory cells utilize a floating gate (or a trapping layer if no floating gate is fabricated in the memory cell) typically made of a non-conductive charge trapping material, one family of commonly used charge trapping materials are nitride based. These nitride based memories are typically referred to as nitride read only memory or NROM.

As stated above, a NAND array architecture arranges its array of floating gate memory cells in a matrix such that the gates of each floating gate memory cell of the array are connected by rows to word select lines. The memory cells of the array are arranged together in strings, typically of 8, 16 or more each, where the memory cells connected together in series, source to drain, between a source line and a column bit line. The NAND architecture floating gate memory array is then accessed by a row decoder activating a row of floating gate memory cells by selecting the word line connected to their gates and driving it at a selected read level voltage, which is typically a low voltage (such as 0V or ground). In addition, the word lines connected to the gates the unselected memory cells of each string are driven by a read pass voltage (such as 4.5V) to operate the unselected memory cells of each string as pass transistors. This allows them to pass current in a manner that is unrestricted by their stored data values. In a read operation, current then flows from the source line to the column bit line through each series connected string, restricted only by the memory cell selected to be read in each string. Thereby placing the current encoded stored data values of the row of selected memory cells on the column bit lines to be sensed. However, before the current can be reliably sensed, the voltages being driven on the word lines of the selected NAND string(s) must settle to their selected levels. As a result, most NAND Flash memories typically have a word line read select delay period that must elapse before the data from the selected NAND strings can be read reliably.

As stated above, one cause of the word line select delay is due to the RC time constant of each word line. The resistance and capacitance of the word lines, represented by this RC time constant, must be overcome by the drivers/row decode circuits of the word lines in changing the voltage level expressed on each word line. In addition, the word lines are generally formed in the NAND array in close proximity to each other and in parallel. Line to line capacitive coupling, therefore, is also a problem and can be a significant factor in the word lines select delay. This is particularly a problem in a read select where capacitive coupling with the read pass voltage placed on the unselected word lines can pull up the selected word line. As the selected word line is coupled to the bulk of the substrate and is being driven at a lower read voltage level, such as 0V, the read pass voltage level, such as 4.5V, applied to unselected word lines only couple the voltage on the selected word line up to a voltage that is less than the applied read pass voltage. This induced voltage may be approximately a third of the applied voltage (or 1.5V if the applied read pass voltage is 4.5V). However, as the word line driver circuit attempts to discharge the induced capacitively coupled voltage, it must overcome both the internal RC of the word line and the capacitance due to the coupling of the line to the adjacent unselected word lines. The time it takes the word line driver circuit to pull the selected word line back down to the target read voltage through its internal RC time constant causes a majority of the word line read select delay and is a major delay factor in the read operation itself.

Figure 3:
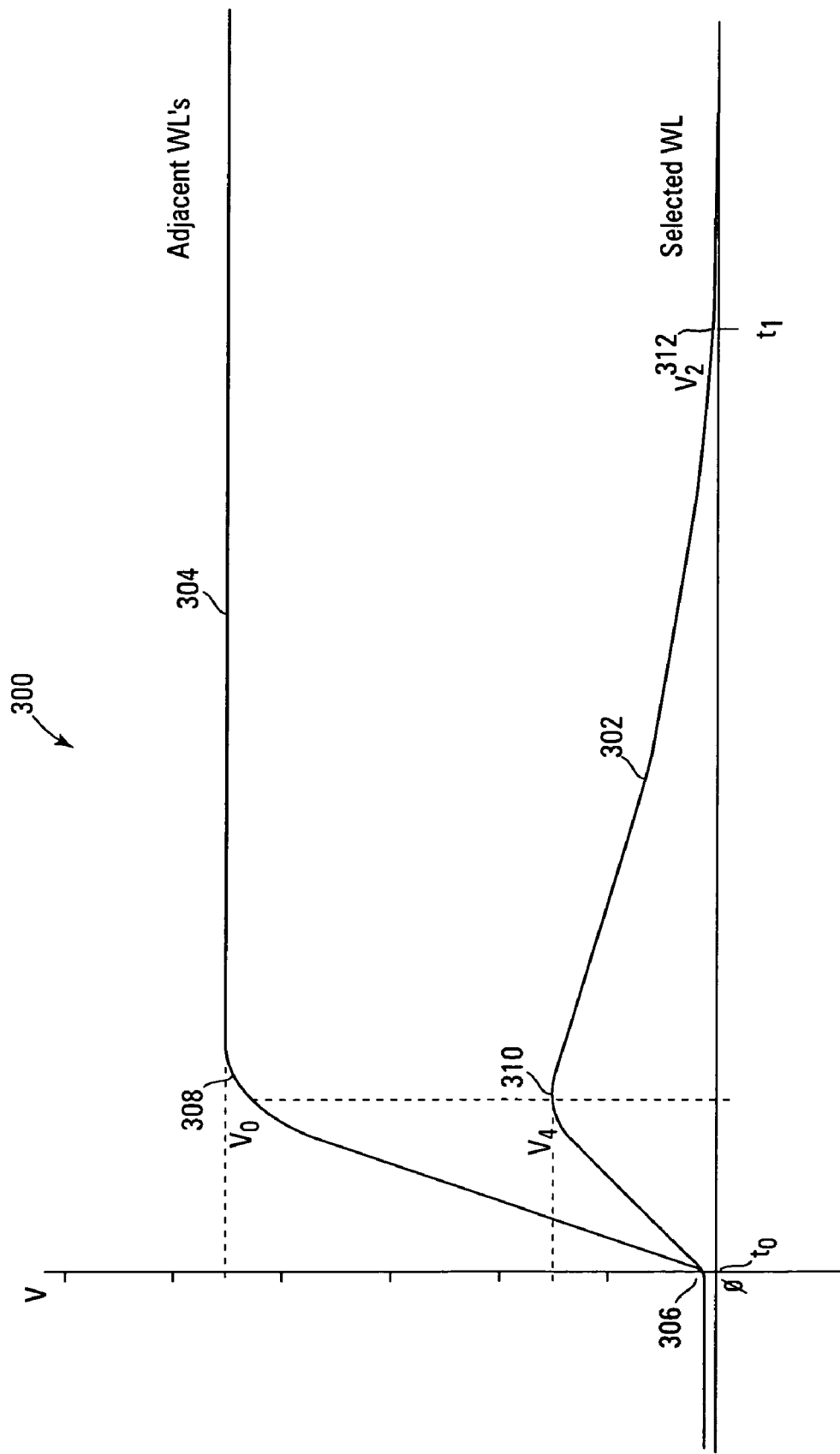
FIG. 3 is a waveform diagram detailing a read operation of a NAND Flash memory of the prior art.

FIG. 3 shows word line waveforms 300 of a NAND Flash memory array of the prior art as they are understood to behave in a read operation with read pass voltages 304 and read select voltage 302. In FIG. 3, the unselected word lines 304 of the word lines 210 coupled to NAND architecture serial strings 204 are driven, starting at time $t_0$, to the target read pass voltage $V_0$ 308. As the unselected word lines 304 are driven upwards to the read pass voltage 308, capacitive coupling raises the voltage on the selected word line 302 to $V_1$ (approximately a 30% coupling). The driver circuit of the selected word line must then pull the voltage level of the line back down against the internal RC of the word line and the capacitive coupling to the adjacent word lines, causing a delay in the selection operation until $t_1$ when the selected word line reaches the target read select voltage $V_3$ 312.

In NAND flash memory arrays and device embodiments of the present invention, read operation word line selection delay is reduced by overdriving the voltages on the adjacent word lines to a higher than required voltage and then reducing them to the target read pass voltage to reduce the voltage induced by capacitive coupling on the selected word line, reducing the overall word line selection delay. Embodiments of the present invention take advantage of the asymmetric nature of the word line to word line capacitive coupling and the internal RC time constant during various voltage level changes of a NAND read operation to reduce word line selection delay.

In NAND Flash memories, the voltage rise induced in the selected word line during a read operation is due mainly to the capacitive coupling effect of the read pass voltage applied to the adjacent unselected word lines. The internal RC time constant of the selected word line, capacitance to the substrate, the coupled word line driver circuit fight the rising voltage of the selected word line from the capacitive coupling of the adjacent unselected word lines. Due to this, the voltage rise in the selected word line induced from the capacitive coupling from an increasing adjacent word line voltage is typically only about a third of the actual applied read pass voltage on the adjacent unselected word lines. In the prior art, however, the discharge of this generated capacitive coupling voltage by the word line driver is opposed by the internal RC of the selected word line and the capacitive coupling of the adjacent word lines, increasing the time required for discharge.

A decrease in the voltage applied to the adjacent word lines induces a voltage fall in the selected word line again due mainly to capacitive coupling. However, only the internal RC time constant of the selected word line fights the decreasing voltage due to capacitive coupling from the adjacent unselected word lines; the coupled word line driver would assist the decreasing word line voltage and drive it to the desired read select voltage. Due to this, the voltage drop induced from a decreasing adjacent word line voltage is much larger, nearly matching the actual decrease in read pass voltage applied to the adjacent word lines.

As noted, capacitive coupling between the selected and unselected word lines produces a larger effect when the voltages are being lowered than being raised. If the initial read pass voltages of the adjacent word lines are reduced after they reach their peak, it will have the effect of damping the voltage initially induced on the selected word line by the rising voltages. Embodiments of the present invention take advantage of this effect to reduce the read word line selection delay by driving the adjacent word lines to an initially higher read pass voltage. This will only slightly increase the voltage induced on the selected word line by capacitive coupling. The applied read pass voltage is then reduced on the adjacent unselected word lines to the target read pass voltage, damping the induced voltage on the selected word line and reducing the word line selection delay.

In one embodiment, only the word lines of a NAND flash memory device that are immediately adjacent to a word line driven at a lower voltage are initially driven higher and then reduced to their target voltage to damp the capacitively coupled voltage on the lower voltage word line. In another embodiment of the present invention, all the adjacent word lines of a selected area of a NAND flash memory device are initially driven higher and then reduced to their target voltage to damp the capacitively coupled voltage on another adjacent word line driven to a lower voltage level.

Figure 4:
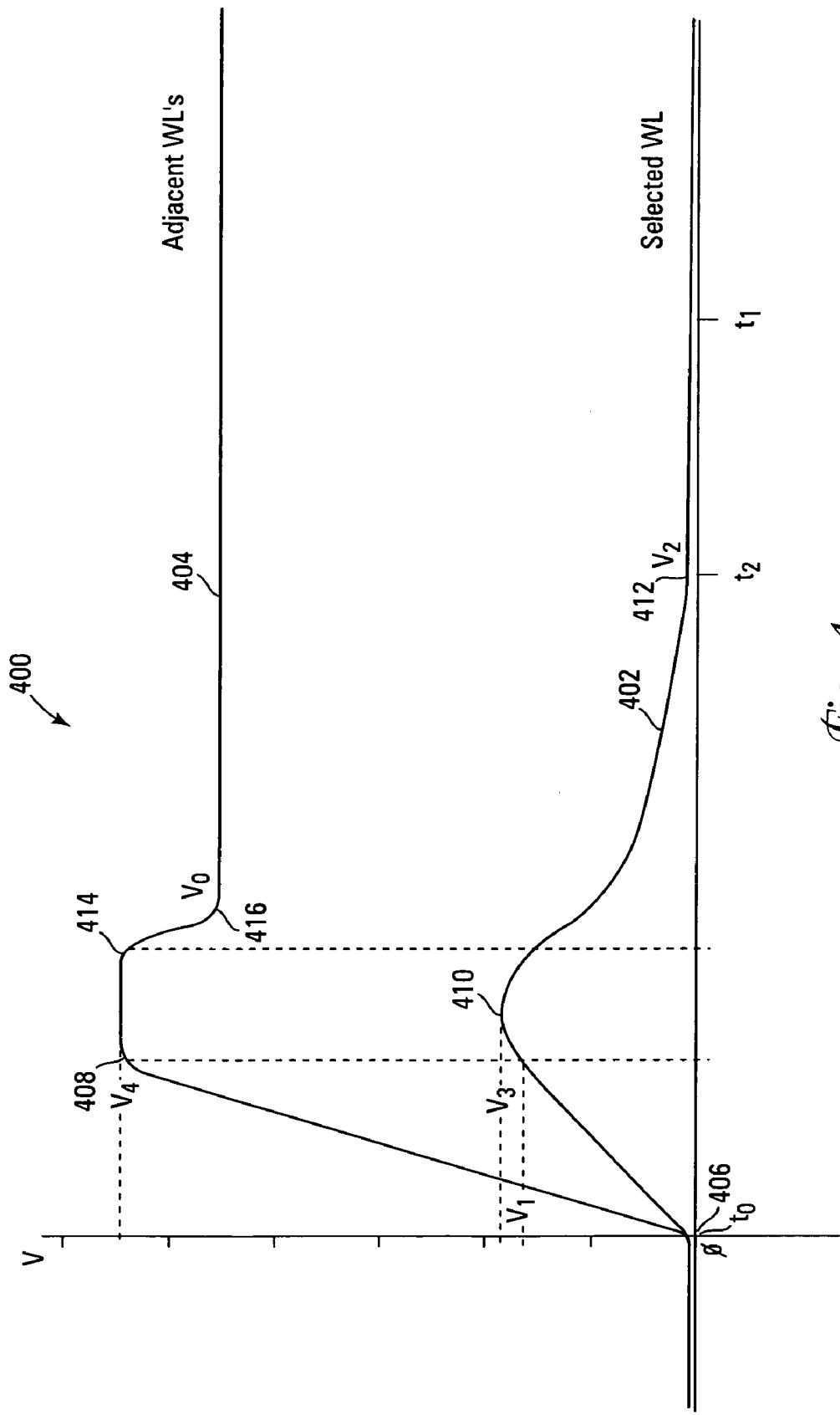
FIG. 4 is a waveform diagram detailing a programming operation of a NAND Flash memory in accordance with an embodiment of the present invention.

FIG. 4 shows word line waveforms 400 of a NAND Flash memory array of an embodiment of the present invention in a read operation with read pass voltages 404 and read select voltage 402. In FIG. 4, the unselected word lines 404 of the word lines 210 coupled to NAND architecture serial strings 204 are driven, starting at time $t_0$, to an initial elevated read pass voltage $V_4$ 408. As the unselected word lines 404 are driven upwards to the read pass voltage 408, capacitive coupling raises the voltage on the selected word line 402 to $V_3$. The unselected word lines 404 are then reduced 414 to the target read pass voltage $V_0$ 416. The reduction of voltage on the unselected word lines 404 from the initial elevated read pass voltage to the target read pass voltage damps the induced voltage $V_3$ 410. This allows the driver circuit of the selected word line then pull the reduced voltage level of the line back down against the internal RC of the word line and the capacitive coupling to the adjacent word lines until the selected word line reaches the target read select voltage $V_2$ 412, reducing the word line read select delay from $t_1$ to $t_2$. Further reductions in word line read select delay may be possible if initial read pass voltages 408 that are of a higher elevated voltage from the target read pass voltage 416 are utilized.

In one example embodiment, the times and voltages for the waveform 400 of FIG. 4 would be as follows. A word line select delay time of 20 µs at $t_1$ for the prior art, which is reduced to 15 µs at $t_2$ for the example embodiment. An initial elevated read pass voltage $V_4$ of 5.5V, which would be reduced to a target read pass voltage $V_0$ of 4.5V. And an induced capacitive coupling voltage $V_3$ of 1.7V, which is reduced to the target selected word line voltage $V_0$ of 0V. It is noted that these voltages and delay times are for purposes of illustration only, and should not be taken as limiting to the scope of the present invention or its embodiments.

The software routines that initialize and operate a device, such as a memory controller or a NAND Flash memory device are collectively referred to as firmware or ROM after the non-volatile read only memory (ROM) machine usable storage device that such routines have historically been stored in. It is noted that such firmware or ROM routines are stored on a variety of machine usable storage mediums that include, but are not limited to, a non-volatile Flash memory, a read only memory (ROM), an electrically erasable programmable read only memory (EEPROM), a one time programmable (OTP) device, a complex programmable logic device (CPLD), a memory controller, an application specific integrated circuit (ASIC), a CD-ROM, a magnetic media disk, etc.

It is noted that other voltage levels, sequences, and optimizations incorporating embodiments of the present invention are possible and will be apparent to those skilled in the art with the benefit of this disclosure.

CONCLUSION

An improved NAND Flash memory and word line selection method has been described, that takes advantage of the asymmetric nature of the word line to word line capacitive coupling to reduce word line selection delay by driving the adjacent word lines to a higher initial voltage and then reducing it to the final target voltage. As the capacitive coupling in between the NAND word lines produces a larger effect when the voltages are being lowered, this has the effect of damping out the voltage initially induced in the lower voltage word line by the rising voltages on the adjacent word lines, reducing the overall selection time. In one embodiment, only the word lines of a NAND flash memory device that are immediately adjacent to a word line driven at a lower voltage are initially driven higher and then reduced to their target voltage to damp the capacitively coupled voltage on the lower voltage word line. In another embodiment of the present invention, all the adjacent word lines of a selected area of a NAND flash memory device are initially driven higher and then reduced to their target voltage to damp the capacitively coupled voltage on another adjacent word line driven to a lower voltage level.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of operating a NAND architecture memory array, comprising:
   applying a read select voltage to a first word line;
   overdriving a pass voltage on one or more adjacent word lines to a first value, wherein the first value is higher than required to operate one or more memory cells coupled to the one or more adjacent word lines as pass gates; and
   reducing the overdriven pass voltage on the one or more adjacent word lines to a second value, while maintaining the read select voltage on the first word line.

2. The method of claim 1, wherein reducing the overdriven pass voltage on the one or more adjacent word lines to a second values further comprises reducing the overdriven pass voltage on the one or more adjacent word lines to a second voltage wherein the second voltage is a normal pass voltage required to operate the one or more memory cells coupled to the one or more adjacent word lines as pass gates.

3. The method of claim 1, wherein the NAND architecture memory array contains a plurality of non-volatile memory cells arranged in rows and columns in a plurality of erase blocks.

4. The method of claim 1, wherein the plurality of memory cells are serially coupled source to drain into a plurality of NAND memory cell strings.

5. The method of claim 1, further comprising sensing a current flowing through a memory cell coupled to the first word line.

6. The method of claim 5, wherein sensing a current flowing through a memory cell coupled to the first word line further comprises waiting for the read select voltage to settle to its selected value before sensing the current flowing through a memory cell coupled to the first word line.

7. A method of accessing a memory array, comprising:
   applying an initial pass voltage to one or more unselected word lines;
   applying a read voltage to a selected word line; and
   reducing the initial pass voltage on the one or more unselected word lines to a final pass voltage, while continuing to apply the read voltage to the selected word line.

8. The method of claim 7, wherein applying an initial pass voltage to one or more unselected word lines further comprises applying an initial pass voltage to one or more unselected word lines that are adjacent to the selected word line.

9. The method of claim 7, wherein applying an initial pass voltage to one or more unselected word lines further comprises applying an initial pass voltage to one or more unselected word lines that capacitively couple to the selected word line.

10. The method of claim 7, wherein the memory array is a non-volatile NAND architecture memory array.

11. A method of operating a memory array during an access, comprising:
   applying a first voltage to one or more first word lines and a second voltage to a second word line, wherein the one or more first word lines are adjacent to the second word line;
   reducing the first voltage on the one or more first word lines to a third voltage while maintaining the second voltage on the second word line; and
   sensing a current flowing through a memory cell coupled to the second word line.

12. The method of claim 11, wherein the memory array is a NAND architecture memory array having a plurality of non-volatile memory cells arranged in rows and columns in a plurality of erase blocks, where the plurality of memory cells are serially coupled source to drain into a plurality of NAND memory cell strings.

13. The method of claim 12, wherein sensing a current flowing through a memory cell coupled to the second word line further comprises waiting for the second voltage to settle to its selected value before sensing the current flowing through a memory cell coupled to the second word line.

14. The method of claim 13, wherein sensing a current flowing through a memory cell coupled to the second word line further comprises sensing a current flowing from a source line to a column bit line in a selected NAND memory cell string containing the memory cell coupled to the second word line.

15. A non-volatile memory device, comprising:
  a memory array having a plurality of non-volatile memory cells arranged in rows and columns; and
  a plurality of word lines, wherein one or more control gates of the plurality of memory cells is coupled to each word line of the plurality of word lines;
  wherein the non-volatile memory device is adapted to place a first voltage on one or more first word lines, place a second voltage on a second word line and then reduce the first voltage to a third voltage, while maintaining the second voltage on the second word line; and
  wherein the one or more first word lines are adjacent to the second word line.

16. The non-volatile memory device of claim 15, wherein the memory array is a NAND architecture memory array having a plurality of non-volatile memory cells arranged in rows and columns in a plurality of erase blocks, where the plurality of memory cells are serially coupled source to drain into a plurality of NAND memory cell strings.

17. The non-volatile memory device of claim 15, wherein the non-volatile memory device is adapted to sense a current flowing through a memory cell coupled to the second word line.

18. The non-volatile memory device of claim 17, wherein the non-volatile memory device is adapted to wait for the second voltage to settle to its selected value before sensing the current flowing through a memory cell coupled to the second word line.

19. A method of reading a NAND architecture memory cell string, comprising:
  applying a select voltage to a word line coupled to a selected memory cell of a NAND architecture memory cell string;
  overdriving one or more adjacent word lines coupled to one or more adjacent memory cells to a higher voltage level than a target voltage level; and
  reducing the voltage on the one or more adjacent word lines to the target voltage level while continuing to apply select voltage to the word line coupled to the selected memory cell.

20. The method of claim 19, further comprising:
  sensing a current flowing from a source line to a column bit line in the NAND memory cell string.

21. The method of claim 20, wherein sensing a current flowing from a source line to a column bit line in the NAND memory cell string further comprises waiting for the select voltage to settle to its target value before sensing the current flowing through the NAND memory cell string.

* * * * *